United States Patent [19]
Eitan

[11] Patent Number: 5,796,313
[45] Date of Patent: Aug. 18, 1998

[54] LOW POWER PROGRAMMABLE RING OSCILLATOR

[75] Inventor: Boaz Eitan, Ra'anana, Israel

[73] Assignee: Waferscale Integration Inc., Fremont, Calif.

[21] Appl. No.: 639,281

[22] Filed: Apr. 25, 1996

[51] Int. Cl.$^6$ .............. H03B 5/04; H03L 1/00; H03L 5/00
[52] U.S. Cl. .............. 331/57; 331/175; 331/183; 331/74; 326/27; 326/81; 327/264; 327/333
[58] Field of Search .............. 326/27, 37, 81, 326/34; 327/261, 262, 393, 395, 396, 333, 264; 331/74, 1 A, 57, 183, 175

[56] References Cited

U.S. PATENT DOCUMENTS

| | | | |
|---|---|---|---|
| 4,910,471 | 3/1990 | Brahmbhatt et al. | 331/57 |
| 5,111,085 | 5/1992 | Stewart | 327/278 |
| 5,406,228 | 4/1995 | Hoang | 331/1 A |
| 5,410,278 | 4/1995 | Itoh et al. | 331/57 |
| 5,416,446 | 5/1995 | Holler, Jr. et al. | 331/57 |
| 5,441,417 | 8/1995 | Korhonen et al. | 331/57 |
| 5,446,418 | 8/1995 | Hara et al. | 331/57 |

*Primary Examiner*—Arnold Kinkead
*Attorney, Agent, or Firm*—Skjerven, Morrill, MacPherson, Franklin & Friel LLP

[57] ABSTRACT

A novel ring oscillator integrated circuit whose frequency of oscillation is independent of supply voltage, temperature and process technology is described. In addition, the ring oscillator circuit consumes low power and its frequency of oscillation is programmable. The ring oscillator comprises one or more inverter sections cascaded together in series. The output of the final inverter stage is coupled to the input of the first inverter stage. Inserted in the feedback loop is feedback control circuitry which functions to control the start/stop operation of the oscillator. Each inverter section includes a p-channel transistor coupled to a parallel combination of impedance and capacitance, which gives the inverter section asymmetric operating characteristics. This asymmetry helps to achieve a frequency of oscillation independent of supply voltage. A plurality of transistors having predetermined impedance's are coupled in series with the p-channel transistor to form the current limiting impedance. An output buffer provides large drive capability and achieves low power consumption by eliminating normally present crowbar current during switching. Pull-down control circuitry provides individual gate control of each of the transistors making up the current limiter in each inverter section. Process independence is achieved by trimming the plurality of pull-down current limiting transistor so as to attain a particular frequency of oscillation.

12 Claims, 7 Drawing Sheets

LOW POWER PROGRAMMABLE RING OSCILLATOR

FIELD OF THE INVENTION

The present invention relates to integrated circuit ring oscillators and in particular to low power programmable ring oscillators whose frequency of oscillation is independent of variations in supply voltage, temperature and process technology.

BACKGROUND OF THE INVENTION

Ring oscillator circuits are well known in the art. A prior art example of a ring oscillator is illustrated in FIG. 1. One way of constructing a ring oscillator is to cascade an odd number of inverters 30 together. The circuit will oscillate at a frequency which is typically dependent on the capacitance of the circuit, the delays associated with the circuit components, variations in supply voltage, temperature and process parameters. Each of the inverters 30 shown in FIG. 1, typically comprises an inverter transistor pair as illustrated in FIG. 2. A p-channel transistor 32 is coupled in series to the supply voltage Vcc. An n-channel transistor 34 is coupled to transistor 32 and to ground. The input is applied to the gates of both transistors 32, 34. The output is taken from the combined drain terminals of the two transistors.

During normal operation of inverter 30, a low input causes transistor 34 to turn off and transistor 32 to turn on, thus pulling the output high. A high input causes transistor 32 to turn off and transistor 34 to turn on, thus pulling the output low. A low is defined as a voltage at or close to ground potential and represented by a '0'. A high is defined as a voltage at or close to the supply voltage and is represented by a '1'. This basic inverter configuration, when used to construct a ring oscillator, however, suffers from several disadvantages. During transitions from a '0' to a '1' and from '1' to a '0', there is a short time period when both transistors are on. A large current, called the crow bar current, is permitted to flow through the inverter during this time period. The amount of current depends on the dimensions of the transistors.

This large crowbar current runs contrary to the constant demand for integrated circuits that use less and less power. The increasing demand for low power integrated circuitry, however, is occurring simultaneously with the attempts to pack more and more transistors onto a semiconductor, further frustrating the goal of achieving lower power integrated circuits.

Another disadvantage of an oscillator based on inverter 30 is that the oscillation frequency may change by an intolerably large amount due to temperature variations from—55° to 125° C., from supply voltage variations from, for example, 4.5 to 5.5 volts and from variations in semiconductor wafer processing.

U.S. Pat. No. 5,416,446, issued to Holler, Jr. et al., teaches a technique for programmably generating a frequency using a ring oscillator. An operating voltage is developed using a programmable array of field effect transistors. Digitally selecting a given set of the transistors provides a given operating current for the ring, which establishes the frequency of operation.

U.S. Pat. No. 5,406,228, issued to Hoang, teaches a ring oscillator, logic counter and comparator unit, bias unit, multiplexor and memory. The frequency of the ring oscillator is controlled automatically by a settable bias current applied to it by the bias unit. The bias unit is controlled by the logic counter and comparator unit which compares the frequency of the ring oscillator with that of an external reference clock signal. The bias current is adjusted in accordance with the measured frequency difference. Once the correct frequency has been reached, the digital settings of the bias current are entered into the memory.

U.S. Pat. No. 5,410,278, issued to Itoh et al., teaches a ring oscillator that comprises a plurality of inverters, a leakage current generating part and a current controlling part. The oscillating frequency of the ring oscillator is directly dependent on the amount of leakage current generated from the leakage current generator.

U.S. Pat. No. 5,446,418, issued to Hara et al., teaches a ring oscillator that includes a plurality of inverters cascaded together. Each inverter includes a pair of transistors having certain channel dimensions so as to have an input capacitance for delaying the signal of a preceding stage inverter for a prescribed time period.

In addition, technique for eliminating the dependency of oscillation frequency on supply voltage, temperature and process technology are known in the art. The prior art devices disclosed above and these various circuit techniques, however, suffer from the disadvantage of consuming much more power than conventional ring oscillator designs. For example, some techniques involve the use of charge pumps and logic sample and hold circuits combined with sophisticated feedback control circuitry. Using these techniques, frequency independence is achieved but the resulting circuits consume much larger amounts of power.

SUMMARY OF THE INVENTION

Accordingly, it is an object of the present invention to provide an improved ring oscillator integrated circuit whose frequency of oscillation is independent of variations in supply voltage, temperature and process technology.

In an another object of the present invention to provide a ring oscillator integrated circuit whose circuit consumes significantly lower power than conventional designs.

Another object of the present invention to provide a ring oscillator integrated circuit whose frequency of oscillation can be tuned using a trimming step in the course of manufacture.

In an embodiment of the present invention there is provided a ring oscillator implemented entirely in CMOS technology as part of an integrated circuit (i.e., chip) device.

There is thus provided in accordance with a preferred embodiment of the present invention, a ring oscillator for generating a periodic signal having a predetermined frequency, the periodic signal stable against variations in supply voltage, temperature and process technology, the ring oscillator including N inverter stages cascaded together, each inverter stage having an input and an output, the output of the $N^{th}$ inverter stage coupled to the input of the first inverter stage, the output of the $N^{th}$ inverter stage forming an output of the ring oscillator, and each the inverter stage including a p-channel transistor having a gate, source and drain, the gate coupled to the input of the inverter stage, the source coupled to a supply voltage, the drain coupled to the output of the inverter stage, the p-channel transistor turning on when the voltage on the gate of the p-channel transistor falls approximately the p-channel threshold voltage plus a delta ($V_{TP}+\Delta$) below the supply voltage, impedance means between the drain of the p-channel transistor and a ground, capacitance means coupled between the drain of the p-channel transistor and the ground, wherein the oscillation frequency of the ring oscillator varies in accordance with the time constant τ of the parallel combination of the impedance means and the capacitance means, and wherein the impedance level of the impedance means is much greater than the impedance level of the p-channel transistor when the p-channel transistor is turned on. The period of oscillation is N times the time constant τ.

In addition, N is a positive odd integer large enough so that the time delay through each the inverter stage is within an order of magnitude of the time delay through the N inverter stages. The capacitance means includes an n-well depletion n-type metal oxide semiconductor (NMOS) transistor and the impedance means comprises a plurality of n-channel transistors, each having a gate, source and drain, the drain coupled to the drain of the p-channel transistor, the source coupled to the ground, the gate coupled to the separate control signal. Each the separate control signal comprises the presence or absence of a constant bandgap reference control voltage.

In addition, the ring oscillator according further includes feedback control circuitry having an input and an output, the input of the feedback control circuitry coupled to the output of the N inverter stages, the output of the feedback control circuitry coupled to the input of the N inverter stages, the feedback control circuitry controlling the start/stop operation of the ring oscillator in accordance with a feedback control signal coupled thereto.

Also included is an output buffer having an input and an output, the input of the output buffer coupled to the output of the $N^{th}$ inverter stage, the output of the output buffer forming a buffered output of the ring oscillator. The output buffer includes a first inverter having an input, an output, a first and second terminal, the first terminal coupled to the supply voltage, a pull-down impedance coupled between the second terminal and the ground, a second inverter having an input, an output, a third and fourth terminal, the fourth terminal coupled to the ground, the input of the first inverter and the input of the second inverter forming the input of the output buffer, a pull-up impedance coupled between the supply voltage and the third terminal, a second p-channel transistor having a gate, source and drain, the gate of the second p-channel transistor coupled to the output of the first inverter, the source of the second p-channel transistor coupled to the supply voltage, a second n-channel transistor having a gate, source and drain, the gate of the second n-channel transistor coupled to the output of the second inverter, the drain of the second p-channel transistor coupled to the drain of the second n-channel inverter, the source of the second n-channel transistor coupled to the ground, a level shifter having an input and an output, the input of the level shifter coupled to the drain of the second p-channel transistor and the drain of the second n-channel transistor, a third inverter having an input, an output, a fifth and sixth terminal, the fifth terminal coupled to a second supply voltage, the sixth terminal coupled to the ground, the input of the third inverter coupled to the output of the level shifter, the output of the third inverter forming the output of the output buffer, a third p-channel transistor having a gate, source and drain, the gate of the third p-channel transistor coupled to the output of the output buffer, the source of the third p-channel transistor coupled to the second supply voltage, the third p-channel transistor driving the output of the level shifter to approximately the level of the second supply voltage, and a fourth p-channel transistor having a gate, source and drain, the gate of the fourth p-channel transistor coupled to the output of the first inverter, the source of the fourth p-channel transistor coupled to the drain of the third p-channel transistor, the drain of the fourth p-channel transistor coupled to the output of the level shifter.

In addition, the first, second and third inverter comprises a fifth p-channel transistor in series with a fifth n-channel transistor and the level shifter comprises an n-channel transistor having a gate, the gate of the level shifter coupled to the supply voltage.

The ring oscillator also includes decoding circuitry for generating the gate control signals, the decoding circuitry which includes a plurality of inverters each having an input and an output, the input of each inverter coupled to an impedance control signal, and a plurality of switches each having an input and an output, the input of each switch coupled to a bandgap reference voltage, the output of each switch forming one of the gate control signals.

Each of the switches includes a sixth p-channel transistor having a gate, source and drain, the gate of the sixth p-channel transistor coupled to the output of one of the inverters, and a sixth n-channel transistor having a gate, source and drain, the gate of the sixth n-channel transistor coupled to the impedance control signal, the source of the sixth p-channel transistor and the source of the sixth n-channel transistor coupled to the bandgap reference voltage, the drain of the sixth p-channel transistor and the drain of the sixth n-channel transistor forming one of the gate control signals.

BRIEF DESCRIPTION OF THE DRAWINGS

The invention is herein described, by way of example only, with reference to the accompanying drawings, wherein.

DETAILED DESCRIPTION OF THE INVENTION

Figure 1:
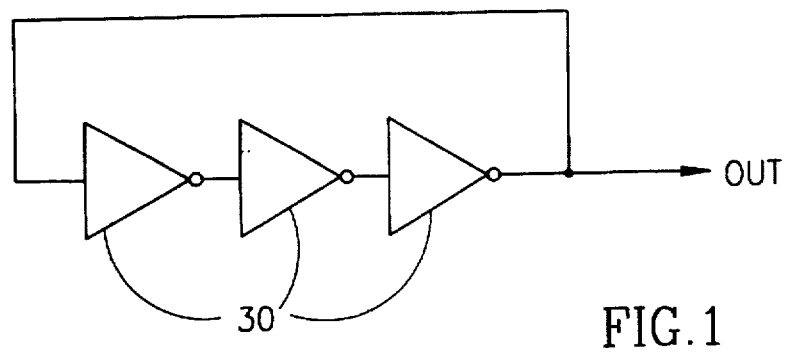
FIG. 1 is a schematic diagram of an example of a prior art ring oscillator constructed using inverters.
Figure 2:
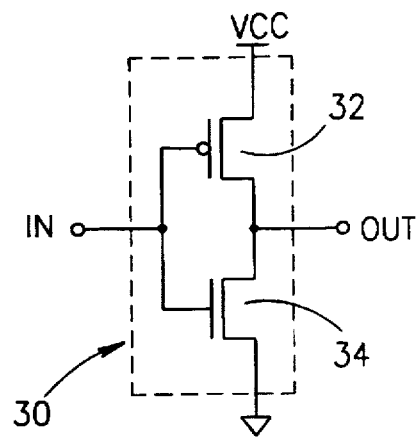
FIG. 2 is a detailed schematic diagram illustrating the prior art structure of each inverter section shown in FIG. 1.
Figure 3:
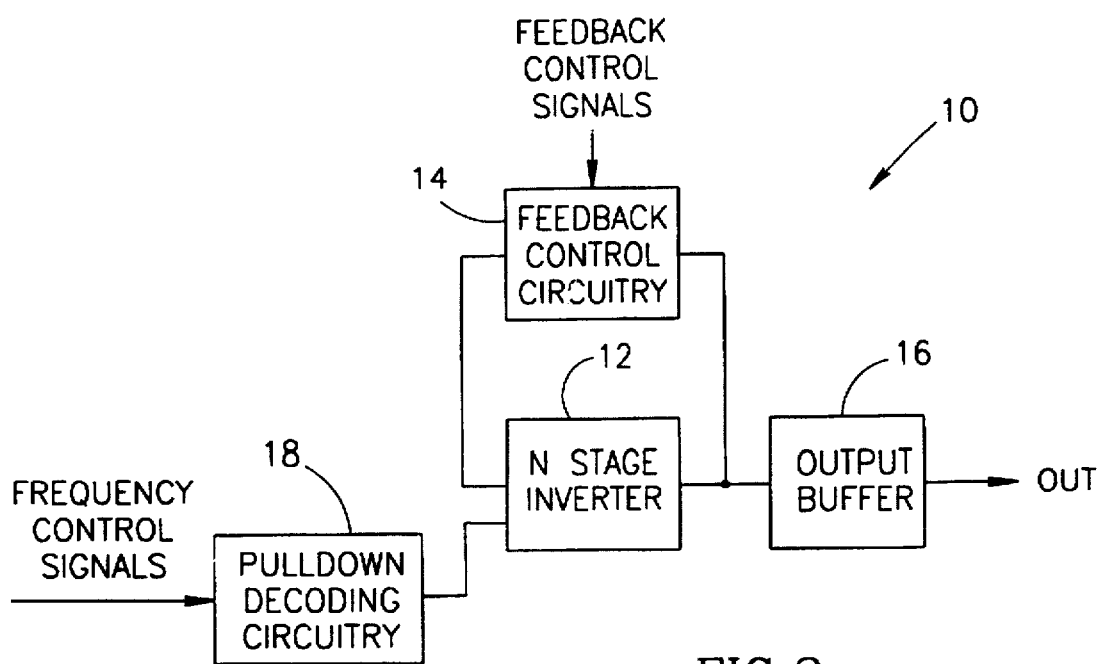
FIG. 3 is a high level block diagram of an example of a ring oscillator constructed in accordance with a preferred embodiment of the present invention.

A high level block diagram of an example of a ring oscillator 10 constructed in accordance with a preferred embodiment of the present invention is illustrated in FIG. 3. Ring oscillator 10 comprises an N stage inverter section 12 whose output is coupled to an output buffer 16 and feedback control circuitry 14. Each stage comprises an inverter transistor pair in series with a current limiting pull-down impedance. The output of feedback control circuitry 14 is fed into the input of N stage inverter 12. Pull-down decoding circuitry 18 generates control signals used within N stage inverter 12. Pull-down decoding circuitry 18 functions to set the frequency of oscillation, as will be explained in further detail, and accepts a number of frequency control signals as input. Feedback control circuitry 14, also explained in more detail below, functions to start and stop the oscillation of ring oscillator 10 and receives a number of feedback control signals as input. Output buffer 16 functions to take as input the relative low drive output of N stage inverter 12 and outputs a signal able to drive a high capacitance load.

Figure 4:
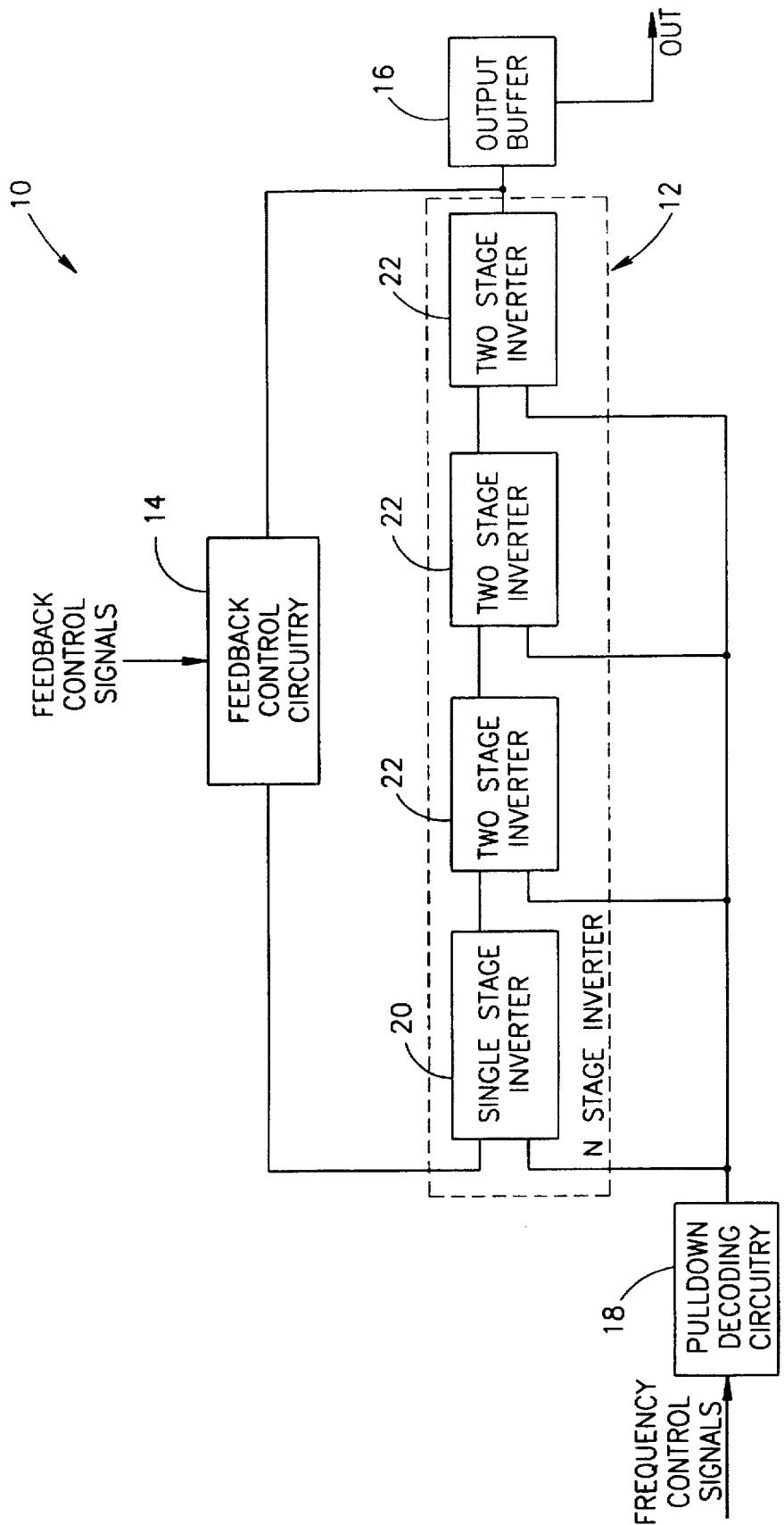
FIG. 4 is a detailed block diagram of the example of a ring oscillator illustrated in FIG. 3.

N stage inverter 12 can comprise any odd integer number N of individual inverter stages. Illustrated in FIG. 4 is a more detailed high level block diagram showing N stage inverter 12 comprising one single stage inverter section 20 and three two stage inverter sections 22. In the example disclosed herein, the number of stages N is equal to 7, however other odd number N inverter stages would also work. Note that there is likely a lower limit to N in that if N is too small, the resulting oscillator will not oscillate. Oscillation will not occur if the delay per stage is of the same magnitude as the total signal propagation time. In other words, if while the output of a stage is still in flux, the output signal has reached around to the input of that particular stage again, the oscillator will not oscillate.

Each single and two stage inverter section receives pull-down control signals output from pull-down decoding circuitry 18. Also illustrated are feedback control circuitry 14 coupling the output of the last two stage inverter 22 to the input of the first single stage inverter 20 and output buffer 16.

Figure 5:
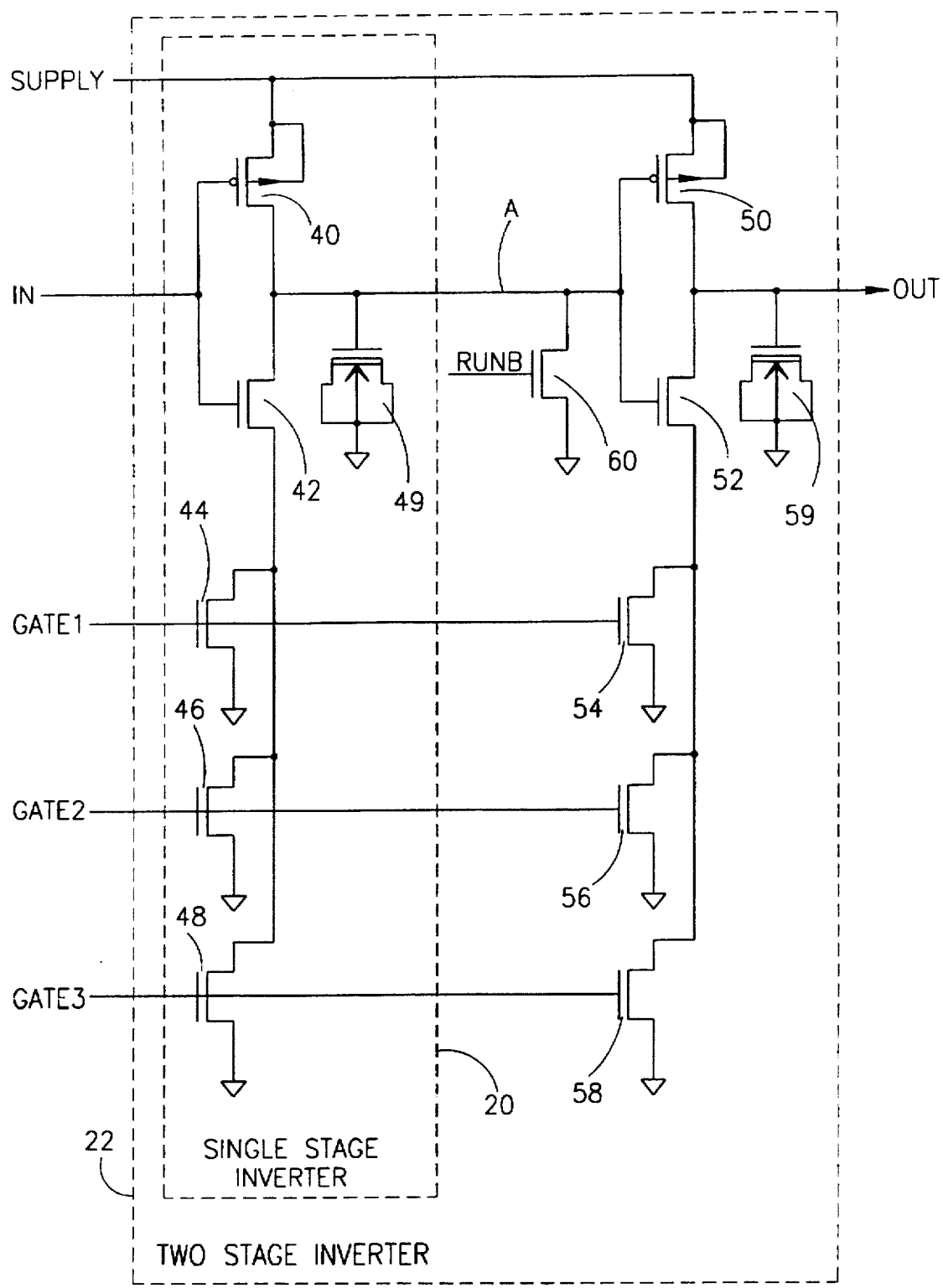
FIG. 5 is a detailed schematic diagram illustrating the single stage and the two stage inverter portions of the ring oscillator of the present invention.

Two stage inverter section 22 will now be described in more detail. A detailed schematic diagram illustrating the single stage and the two stage inverter portions of ring oscillator 10 is shown in FIG. 5. It is noted that two stage inverter section 22 comprises two single stage inverter sections 20 cascaded together, thus the description of the operation of single stage inverter 20 is implied in the description of the operation of two stage inverter section 22. The first single stage inverter portion comprises p-channel transistor 40 coupled to an n-channel transistor 42 in a conventional inverter configuration. The gates of transistors 40, 42 are coupled together and receive the input to this inverter stage. In the example disclosed herein, transistor 40 has a width/length of 2.4/2.4 and transistor 42 has a width/ length of 2.4/0.9 (all transistor gate width/length measurements are specified in micrometers). Notwithstanding the dimensions given in the example above, other combinations of width and length are also suitable as would be known by one skilled in the art. The source terminal of transistor 42 is coupled to the drain terminals of pull-down n-channel transistors 44, 46, 48. The gates of transistors 44, 46, 48 are coupled to signals GATE1, GATE2, GATE3, respectively, and the source terminals are connected to ground. The width/length dimensions of transistors 44, 46, 48 are 1/22.5, 1/45, 1/67.5, respectively. The drain terminals of transistors 40, 42 comprise the output of the single inverter stage. Coupled to the output of the first single inverter stage (i.e. the drain terminals of transistors 40, 42) are the gate terminals of an n-well depletion n-channel metal oxide semiconductor (NMOS) transistor 49 having a width/length of 20/8 and whose drain, source and body terminals are coupled to ground. The function of transistor 49 is to act as a relatively large capacitor, much larger than the input capacitance of transistors 50, 52.

The second cascaded half of two stage inverter 22 is similar to the first single inverter stage and comprises p-channel transistor 50 and n-channel transistor 52 configured as an inverter pair, pull-down n-channel transistors 54, 56, 58 and n-well depletion NMOS transistor 59. The output of inverter transistor pair 40, 42 is coupled to the input of inverter transistor pair 50, 52. An n-channel transistor 60, coupled to the input of the second inverter pair 50, 52, functions as a portion of the start/stop circuitry for turning ring oscillator 10 on and off. Transistors in the second inverter stage have width/length dimensions identical to corresponding transistors in the first inverter stage.

Figure 9:
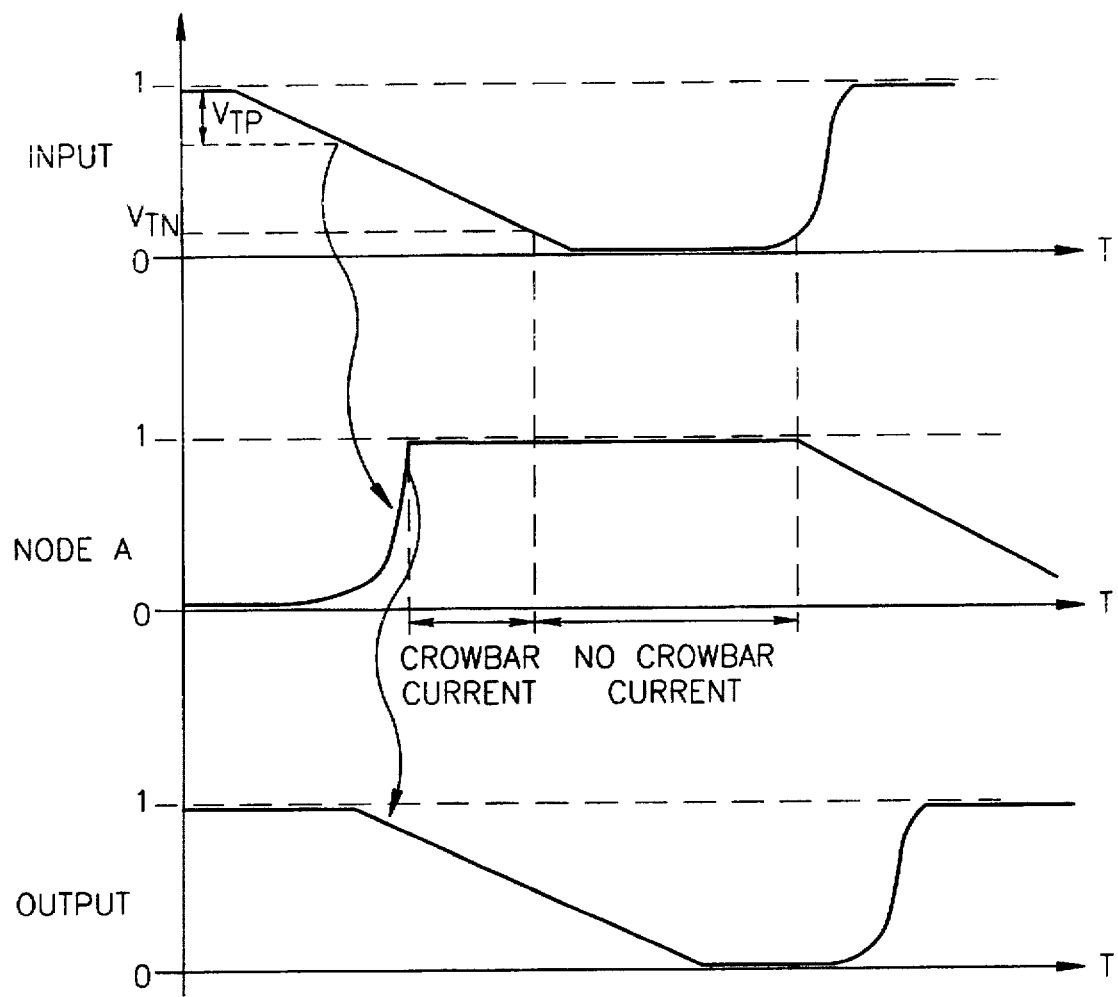
FIG. 9 illustrates the voltage signals that are present at various points within the two stage inverter portion of the present invention.

The operation of two stage inverter section 22 will now be described with reference to FIG. 5 and to FIG. 9 which illustrates the signals present at the input, node A and the output of two stage inverter 22. As discussed previously, it is an object of the present invention to provide a ring oscillator whose frequency is relatively independent of variations in Vcc, temperature and process technology. In addition, it is an objective that the ring oscillator circuitry consume relatively little power. These objectives are achieved, in part, through the utilization of an asymmetric inverter transistor pair 40, 42 and 50, 52 each coupled to a relatively large pull-down impedance comprising transistors 44, 46, 48 and 54, 56, 58. These pull-down transistors function as switched impedances. Each pull-down transistor can be switched into the circuit and when switched, acts as an impedance. The drive ratio between p-channel transistor 40 and the drive of each n-channel transistor 44, 46, 48 is relatively high. N-channel transistor 42 is basically a short when on, relative to any one of current limiting transistors 44, 46, 48.

Assuming initially that a '1' is present at the gates of transistors 40, 42, p-channel transistor 40 is off, n-channel transistor 42 is on, p-channel transistor 50 is on and n-channel transistor 52 is off. Capacitor 59 (i.e. n-well depletion NMOS transistor 59) is already charged and the output of two stage inverter 22 is a '1'. Capacitor 49 (i.e. n-well depletion NMOS transistor 49) has been discharged through transistor 42 and one or more of pull-down transistors 44, 46, 48. The asymmetry between transistor 40 and current limiting transistors 44, 46, 48 is reflected in the difference in drive capability between them. Transistor 40 has much more drive capacity than any of current limiting transistors 44, 46, 48 due to the difference in transistor geometry. As the input to the inverter transistor pair 40, 42 makes the transition from a '1' to a '0' transistor 40 will begin to conduct and transistor 42 will begin to turn off. Transistor 40 will turn on when its gate input voltage drops below the supply voltage by an amount equal to the p-channel threshold voltage $V_{TP}$. This is in contrast to a conventional inverter transistor pair wherein the effective input switching threshold is typically one half the supply voltage.

Due to the large drive capacity of transistor 40, capacitor 49 is quickly charged, thus quickly raising the gate voltage of transistors 50, 52 (i.e. the input to the second inverter stage) to a high level. As its gate voltage rises, transistor 50 turns off and transistor 52 begins to drive the output low, sinking current from capacitor 59 through the impedance comprising one or more pull-down transistors 54, 56, 58. When on, transistor 52 is a relative short. However, the high current limiting impedance of transistors 54, 56, 58 cause capacitor 59 to discharge at a relatively slow rate, much slower than the rate of charging through transistor 50. As capacitor 59 discharges, the output voltage begins to drop. At the point the output voltage drops to a level $V_{TP}$ below the supply voltage, the p-channel transistor of the next inverter section begins to turn on.

As the input to transistors 40, 42 makes the transition from a '0' to a '1', transistor 42 begins to turn on when the input rises above the n-channel threshold $V_{TN}$. The voltage at node or point A was at a high and begins to fall after the input voltage rises past $V_{TN}$. As was shown above, transitions from '0' to '1' occur relatively quickly due to the high drive capability of transistors 40, 50. Thus, the input to transistor 40 quickly rises past $V_{TP}$, shutting it off. The voltage at node A, however, slowly drops due to the slow discharge of capacitor 49 through transistor 42, which is practically a short by now, and current limiting transistors 44, 46, 48. The RC time constant τ is given by:

$$\tau = \frac{\Delta V \cdot C}{I} = \frac{V_{TP} + \Delta}{I} \cdot C$$

Where I is the current flowing through transistor 42 and C is the capacitance of transistor 49.

The key to the present invention and critical to achieving frequency stability of ring oscillator 10, is that transistor 50, of the following inverter section, will not turn on until the voltage on node A drops an amount equal to $V_{TP}$ from the supply voltage, whatever it is, plus a small delta amount. Thus, the time when the following inverter section is switched is determined not by the supply voltage but by the p-channel threshold $V_{TP}$ and more importantly by the discharge rate time constant RC made up of current limiting transistors 44, 46, 48 and capacitor 49, all of which can be closely controlled during manufacture. The time of turn on of the p-channel transistor of the following section is made independent of the supply voltage, since $V_{TP}$ does not vary with the supply voltage.

The n-channel pull-down transistors function to limit the current through the pair of transistors comprising the inverter. Thus, the crowbar current in each inverter section is much lower than in conventional inverter circuits but is limited to the current limiting capability of transistor 44, 46, 48. Even at low frequencies wherein both inverter transistors are on for a relatively long period of time, the crowbar current is kept low due to the current limiting n-channel pull-down transistors.

As can be seen, n-channel transistor 42 does not play a large role in the frequency stability of ring oscillator 10 since it is the discharge rate of capacitor 49 through current limiting transistors 44, 46, 48 that is crucial to the circuit timing. Transistor 42 simply acts as a short during when it is on. It does, however, function to reduce the total crowbar current that flows through the inverter during operation of the oscillator. Referring to inverter pair 40, 42, crowbar current does not begin to flow until the input voltage drops low enough to turn on p-channel transistor 40, source current to the input of transistor 50, 52 and cause current to flow through current limiting transistors 44, 46, 48. Transistor 42 has not shut off yet because the input voltage has not dropped below $V_{TN}$. If transistor 42 was not in the circuit, crowbar current would flow from the moment transistor 40 turns on until the input transition from a '0' to a '1', shutting off transistor 40, which is a significant amount of time later. With transistor 42 in the circuit, however, crowbar current ceases to flow the moment the input drops below $V_{TN}$ plus a delta which causes transistor 42 to completely shut off.

The n-channel pull-down or current limiting transistors in each inverter section comprise three n-channel transistors of varying impedance. Other numbers of transistors other than three would also work as well. Transistors 44, 46, 48 have a width/length of 1/22.5, 1/45, 1/67.5, respectively. The gates of long channel transistors 44, 46, 48 are controlled by three gate signals GATE1, GATE2, GATE3, respectively. Different impedance values can be achieved for the total current limiting impedance by varying the three gate signals. Each gate signal turns one of the three transistors on or off. Using three pull-down transistors provides for eight different impedance settings. Using more than three pull-down transistors gives finer resolution and control over the overall current limiting impedance. In addition, the gates of the pull-down transistors are preferably driven by a bandgap reference control voltage rather than the regular supply voltage, thus the GATE signals are not dependent on Vcc. The bandgap reference is a stable reference voltage independent of temperature, determined by the process technology and typically has a voltage level of approximately 1.3 volts. Bandgap reference circuits are well known in the art and will not be described further.

Using multiple current limiting transistors having varying gate lengths provides the mechanism by which a stable oscillator frequency across process corners can be achieved. Variations in process technology are removed by programming the pull-down transistors during a calibration or trimming process during manufacture. Different frequencies of oscillation are achieved by varying which pull-down transistors are on (i.e. their impedance added to the total current limiter impedance) and which remain off. Since the frequency of oscillation is determined by the RC time constant τ, if the resistance R is varied, the oscillation frequency will vary accordingly. The resistance R can be varied by selectively turning on and off the pull-down transistors. In the example of FIG. 5, three pull-down transistors are shown, thus providing for one of eight resistance values, each resistance value corresponding to a different frequency.

A trimming process during manufacturing can be used to fine tune the oscillation frequency of the ring oscillator. The circuit would initially be produced having the pull-down transistors set in the middle position (e.g., resistance level 4) so as to give the greatest leeway in adjusting the frequency higher or lower. During the final test portion of the manufacturing process, when package part testing is performed, the frequency of the ring oscillator is directly measured at an output pad or pin. A test mode is designed into the device that is active to switch the oscillator output to a pad or output pin. Based on the difference with the desired frequency, one or more pull-down transistors are put into or taken out of the circuit. Thus, a trimming process during manufacture of the IC can be used to fine tune the oscillator against process technology variations.

As described previously, the frequency of oscillation of conventional ring oscillators is affected by Vcc, temperature and process variation. The frequency is also affected by the capacitance of the circuit, the threshold voltage $V_T$ of the p-channel transistors, the bandgap reference voltage and the long n-channel current limiting transistors. As previously discussed, the long n-channel pull-down transistors provide a programmable option and are trimmed during the manufacturing process to fine tune the oscillation frequency.

The capacitance of the transistors making up a conventional oscillator circuit also affects the oscillation frequency. Variations in the capacitance from transistor to transistor prevents the oscillation frequency from being independent of circuit capacitance. To eliminate the effect of circuit capacitance variations, a capacitance relatively much larger than the capacitance's of the individual circuit components is placed in the circuit loop. The frequency of oscillation becomes dependent instead on the large capacitance, as described previously, rather than the individual transistor capacitance's. Transistors 49, 59 function as large capacitors and are constructed to dwarf the capacitance's of the rest of the circuit. Thus, the frequency of oscillation is now controlled by the geometry and the process of transistors 49, 59, both of which can be managed by suitable design and manufacture, rather than the various capacitance's of the other circuit elements.

As an aid in understanding the basic operating principle of the present invention each single inverter section can be constructed in the following manner. At the core of each section is a p-channel transistor whose gate is coupled to the input to the inverter section, whose source is coupled to the supply voltage and whose drain is the output to the following inverter section. Also coupled to the drain are a resistor and capacitor connected in parallel and having a predetermined time constant τ. When the input is low, the transistor turns on quickly and charges the capacitor causing the output to go high. The leakage through the resistor is inconsequential. When the input goes high, the transistor turns off. The moment the transistor turns off, the capacitor begins to discharge through the resistor. Since the value of both the resistor and capacitor can be closely controlled, the rate of discharge can also be controlled and it is the rate of discharge of the capacitor that determines when the transistor of the next inverter section turns on, which, in turn, determines the frequency of oscillation. The resistor comprises transistors 44, 46, 48 (FIG. 5) and the capacitor comprises transistor 49. Note that it is not necessary that for transistor 42 to be in the circuit for the ring oscillator to work.

The variations of oscillation frequency due to Vcc are eliminated by using an asymmetrical inverter configuration (i.e., a high drive p-channel transistor in series with a low drive current limiter), as previously described above. The p-channel pull-up transistor in each inverter section has a much higher drive capability than the n-channel current limiting transistors. This causes the inverter trip point to be a voltage approximately equal to Vcc–($V_{TP}$+Δ), the delta being a value much smaller than $V_{TP}$ itself. The threshold voltages $V_{TP}$ and $V_{TN}$ typically vary approximately +/–0.1 V and are generally a function of gate oxide thickness $T_{OX}$ and temperature. The programmable n-channel pull-down current limiting transistors remove any variation in frequency due to process variations. The delay time of the inverter section is related to the current flow which is given by:

$$I = \beta\mu(T)[V_{GS} - V_T(T)]^2$$

Where β is a non temperature dependent constant of the process technology and both the mobility, μ, and $V_T$ are temperature dependent. The voltage $V_{GS}$, however, can be replaced by the bandgap reference voltage, $V_{BGREF}$, since the current limiting transistors are driven by this gate drive signal. The RC time constant τ can then be expressed as:

$$\tau = \frac{\Delta V \cdot C}{I} = \frac{(V_{TP}(T) + \Delta) \cdot C}{I}$$

Thus τ can be expressed as:

$$\tau = \frac{(V_{TP}(T) + \Delta) \cdot C}{\beta\mu(T)[V_{BGREF} - V_T(T)]^2}$$

Since the mobility μ decreases as the temperature increases (i.e., it has a negative temperature coefficient), the current term I decreases causing τ to increase. Similarly, the threshold voltage $V_{TN}$ decreases with increasing temperature causing the current I to increase and consequently τ decreases. The threshold voltage $V_{TP}$ also decreases with increasing temperature causing τ to decrease. However, overall, the affects of temperature on each individual element tend to cancel each other out achieving a level of temperature compensation for the delay time. The value of the bandgap reference voltage $V_{BGREF}$ can be adjusted so as to achieve an overall canceling effect between the three temperature sensitive parameters.

Low power consumption is achieved by a combination of techniques, namely: the use of a bandgap reference voltage to reduce transistor gate drive, the use of long channel n-type transistors for the current limiters and the elimination of the crowbar current in output buffer 16, which is described in more detail below. An integrated circuit ring oscillator constructed in accordance with the present invention utilizing the above techniques exhibits a voltage independence from 2.7 V to 5.5 V. In addition, a swing in temperature from –55° to 150° C. results in a variation in frequency of only +/–3 percent.

Figure 6:
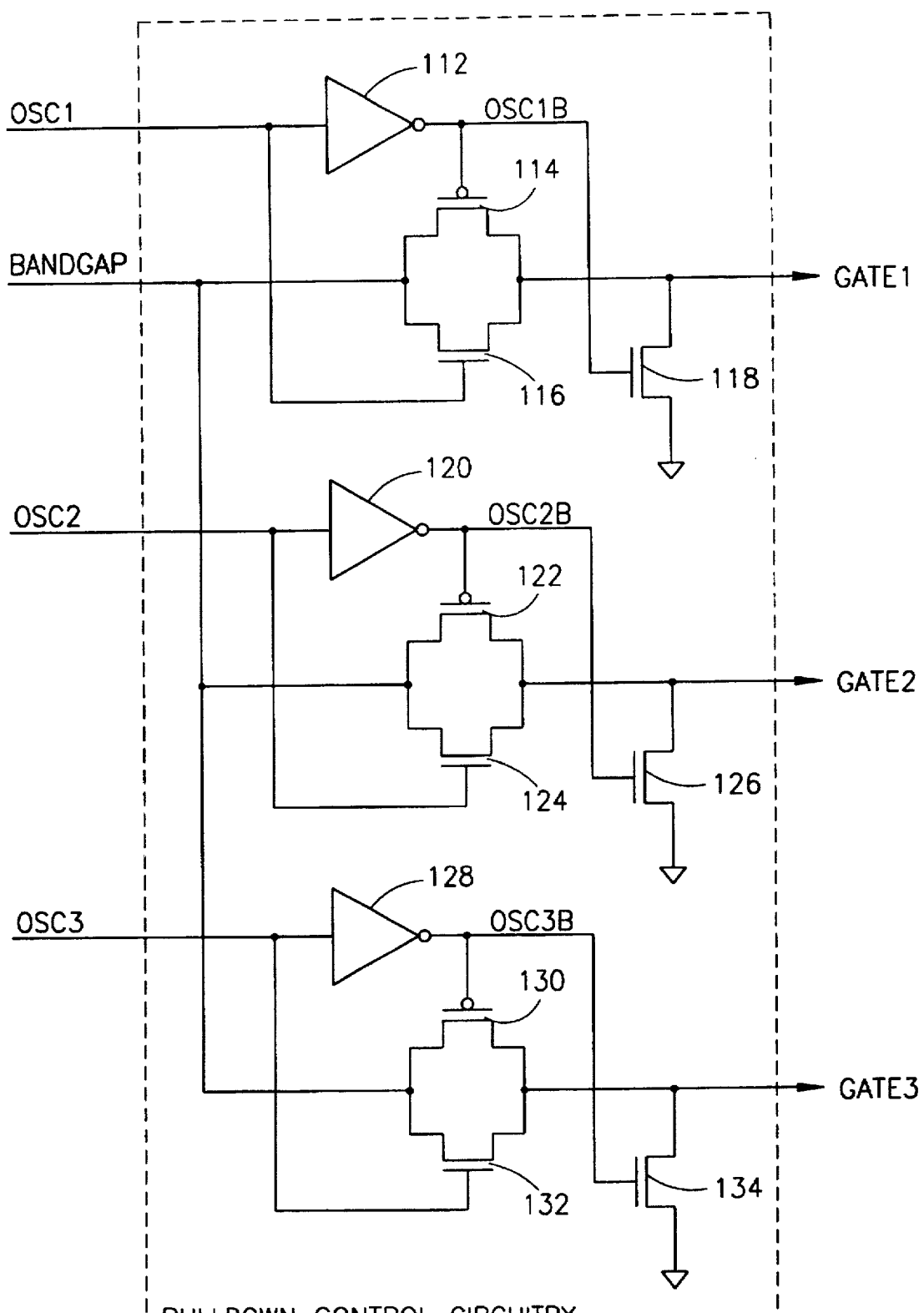
FIG. 6 is a detailed schematic diagram illustrating the pull-down decoding circuitry portion of the ring oscillator of the present invention.

Pull-down decoding circuitry 18 will now be described in more detail. A detailed schematic diagram illustrating the pull-down decoding circuitry portion of the ring oscillator is shown in FIG. 6. The function of pull-down control circuitry is to control the amount of impedance in each current limiter coupled to each inverter section (FIG. 5, i.e. transistors 44, 46, 48). Each transistor making up the current limiter has a separate circuit to control its gate signal. Thus, three gate signals are generated, GATE1, GATE2, GATE3, one for each current limiting transistor. The signal applied to the gate of each transistor that is to be turned on is the stable bandgap reference control voltage signal indicated by BANDGAP in FIG. 6. Three impedance control signals OSC1, OSC2, OSC3 are coupled to inverters 112, 120, 128, respectively and n-channel pass transistors 116, 124, 132, respectively. The output of inverters 112, 120, 128 generate signals OSC1B, OSC2B, OSC3B, respectively and are coupled to the gates of p-channel pass transistors 114, 122, 130, respectively and to the gates of n-channel transistors 118, 126, 134, respectively. For a transistor to be added to the total current limiting impedance, its corresponding input control signal must be high, turning on the n-channel pass transistor and causing the output of the inverter to go low, thus turning on the p-channel transistor and turning off the n-channel pull-down transistor coupled to ground. The drain terminals of transistor pairs 114, 116; 122, 124; 130, 132 are coupled together to generate gate control signals GATE1; GATE2; GATE3, respectively. When a gate control input signal is high, the BANDGAP reference signal appears at the corresponding GATE signal output, adding the associated impedance to the total current limiting impedance. Depending on the desired impedance of the current limiter, one or more of the signals OSC1, OSC2, OSC3, is set high. If all are low, feedback control circuitry 14 (FIG. 8) prevents ring oscillator 10 from oscillating.

Output buffer 16 will now be described in more detail. As known in the art, conventional output buffers typically have large crowbar currents associated with them. A main object of the present invention is to generate an oscillator signal using as little current as possible. Thus, the present invention replaces a conventional output buffer circuit with a break before make stage coupled to an output buffer, the combination eliminating any large crowbar currents, drawing relatively little power and providing the high drive needed at the output.

Figure 7:
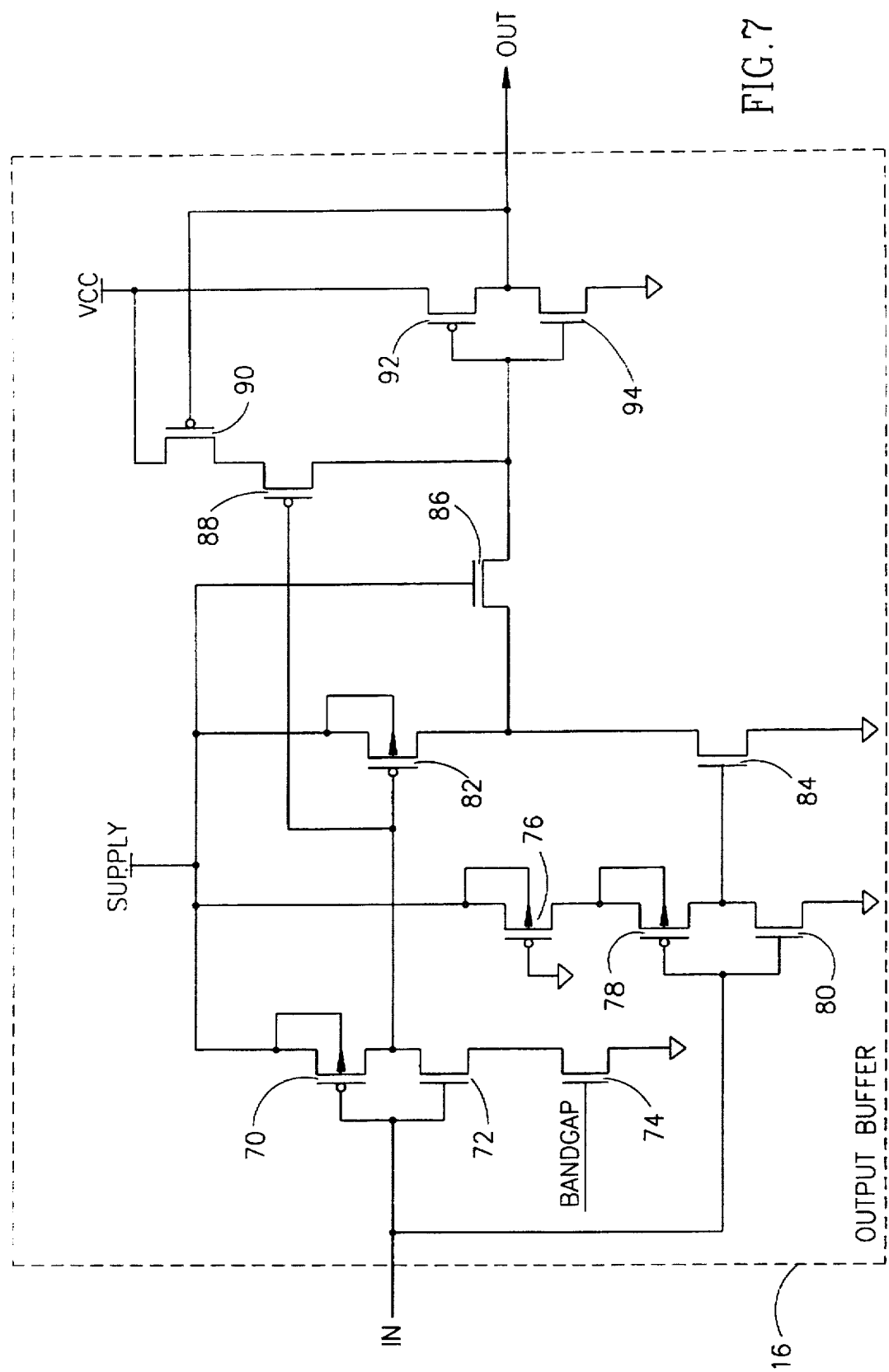
FIG. 7 is a detailed schematic diagram illustrating the output buffer circuitry portion of the ring oscillator of the present invention.

A detailed schematic diagram illustrating the output buffer portion of ring oscillator 10 is shown in FIG. 7. The function of output buffer 16 is to transform the relatively weak output signal from the final inverter stage into a signal that can drive high capacitive loads. In addition, the output buffer circuitry must consume as little current as possible. To achieve these goals, two asymmetrical low power inverter stages are used, wherein the traditionally present crowbar current is eliminated by utilizing a break before make technique. In the first inverter stage, a slow pull-down 72 and a fast pull-up 70 are utilized. In the second inverter stage, a fast pull-down 80 and a slow pull-up 78 are utilized. The concept is to use a conventional p-channel/n-channel inverter pair but provide separate controls for each transistor. Each of the controls, in turn, comprises an asymmetrical inverter pair in series with a current limiter. The p-channel transistor is basically controlled by a fast pull-up transistor and a slow pull-down current limiter. The n-channel transistor is basically controlled by a slow pull-up current limiter and a fast pull-down transistor.

The input to output buffer 16 is coupled to an inverter transistor pair 70, 72 which is in series with a long channel n-type pull-down current limiting transistor 74 whose width/length is 1/40. The gate of transistor 74 is coupled to the BANDGAP reference voltage signal. The source terminal of transistor 70 is coupled to the supply voltage. The output of inverter transistor pair 70, 72 is coupled to the gate of p-channel transistor 82 having gate dimensions of 5/1.1 for high drive purposes. The input to output buffer 16 is also coupled to the input of inverter transistor pair 78, 80. In series with inverter transistor pair 78, 80 is a long channel p-type pull-up current limiting transistor 76, whose gate is tied to ground and whose dimensions are 1/40. The output of inverter transistor pair 78, 80 is coupled to n-channel transistor 84.

The output of inverter transistor pair 82, 84 is coupled to an n-channel transistor 86 which functions as a level shifter. The drain terminal of transistor 86 is coupled to the input of inverter transistor pair 92, 94. The dimensions of p-channel transistor 92 and n-channel transistor 94 are 10/1.1 and 5/0.9, respectively. The widths of the gates on transistors 92, 94 are large in order to provide high drive currents. Coupled in series between Vcc and the drain terminal of transistor 86 are two p-channel transistors 90, 88.

The operation of output buffer 16 for an input transition from a '1' to a '0' to a '1' will now be described. If the input is initially a '1', transistors 70, 78, 84, 92 are off and transistors 72, 80, 82, 94 are on. The input to the level shifter is high and the output of the buffer is a '0'. The output of the buffer is fed back to the gate of transistor 90. Both transistors 88 and 90 are on, raising the level of the signal from the SUPPLY level to the level of Vcc. Level shifter 86 is necessary in the case where the SUPPLY voltage is less than the Vcc voltage.

As the input transitions from a '1' to a '0', transistor 70 turns on at the point where the input voltage falls to a level $V_{TP}+\Delta$ below the supply voltage. Although transistor 72 is still on, the crowbar current is minimal due to current limiting transistor 74. Transistor 70, practically a short, drives the gate of transistor 82 high. Although transistor 72 can also be considered a short, transistor 70 provides sufficient current to keep the gate of transistor 82 high, immediately turning it off. Thus, at the voltage $V_{SUPPLY}-(V_{TP}+\Delta)$ both transistors 82 and 84 are off. Transistor 78 also turns on but cannot drive transistor 84 because it is current limited by current limiting transistor 76. In addition, any current flowing through transistor 78 is sunk by transistor 80 which is practically still a short. Only after the input drops to $V_{TN}-\Delta$ can transistor 80 completely turn off thus allowing transistor 84 to turn on through transistors 76, 78, thus guaranteeing a break before make of transistors 82, 84 respectively.

As soon as the output of transistor 70 goes high, not only does transistor 82 immediately shut off but transistor 88 turns off as well. Transistor 84 drives the input to level shifter 86 low (i.e., the input to inverter transistor pair 92, 94) causing the output OUT of the output buffer to go high.

As the input to the buffer transitions from a '0' to a '1', transistor 72 will begin to turn on when the input rises past $V_{TN}+\Delta$. Although the impedance of transistor 72 quickly drops, it cannot drive the input to transistor 82 low because transistor 72 is drive limited by current limiter 74. As the input voltage rises, transistor 70 continues to drive the input to transistor 82 high, keeping it off. Transistor 80, however, also begins to turn on as the input voltage rises past $V_{TN}+\Delta$ but in this case, the drive of transistor 80 is not limited and immediately drives the gate of transistor 84 low, turning it off. Thus, transistor 84 turns off while transistor 82 still remains off. As the input increases, transistor 70 eventually turns off when the input rises past $V_{TP}-\Delta$ causing the gate of transistor 82 to go low, turning it on. Thus, a break before make is also guaranteed for a '0' to '1' transition.

Transistor 82 turning on drives the input to level shifter 86 high. Level shifter 86 is needed to prevent the p-type drain and the n-type body (or substrate) of transistor 82 from becoming a forward biased diode and destroying the operation of the output buffer. This is likely to happen if the supply voltage is lower than Vcc. Due to the $V_{GS}$ drop across the level shifter, the voltage level input to inverter pair 92, 94 would be limited to $V_{SUPPLY}-V_{TN}$, limiting the drive of the final output stage leaving the inverter pair 92, 94 partially on and defeating the goal of low current. Transistor 90 acts to raise the voltage of the input to inverter pair 92, 94 to Vcc when the output OUT is low, thus causing transistor 94 to be driven fully.

The function of transistor 88 will now be described. As previously described, as the input to the output buffer changes from a '1' to a '0', the output of transistor 70 goes from a low to a high, turning off transistor 82. In addition, transistor 78 goes from a low to a high turning on transistor 84. At this point in time, however, the output OUT is still low, keeping transistor 90 on. Without transistor 88, crowbar current flows through the path including transistors 90, 86 and 84. Transistor 90 cannot shut off immediately because of the inherent delay in the signal through the final output inverter stage. Crowbar current continues to flow up until transistor 94 turns off and transistor 92 turns on, at which point transistor 90 turns off. Thus, transistor 88 functions to eliminate the crowbar current by eliminating the current flow through transistor 90. Transistor 88 turns off at the same time transistor 82 shuts off, guaranteeing that no crowbar current can flow through transistor 84. This is because, as explained above, transistor 82 shuts off before transistor 84 turns on due to their different gate drive signal.

Figure 8:
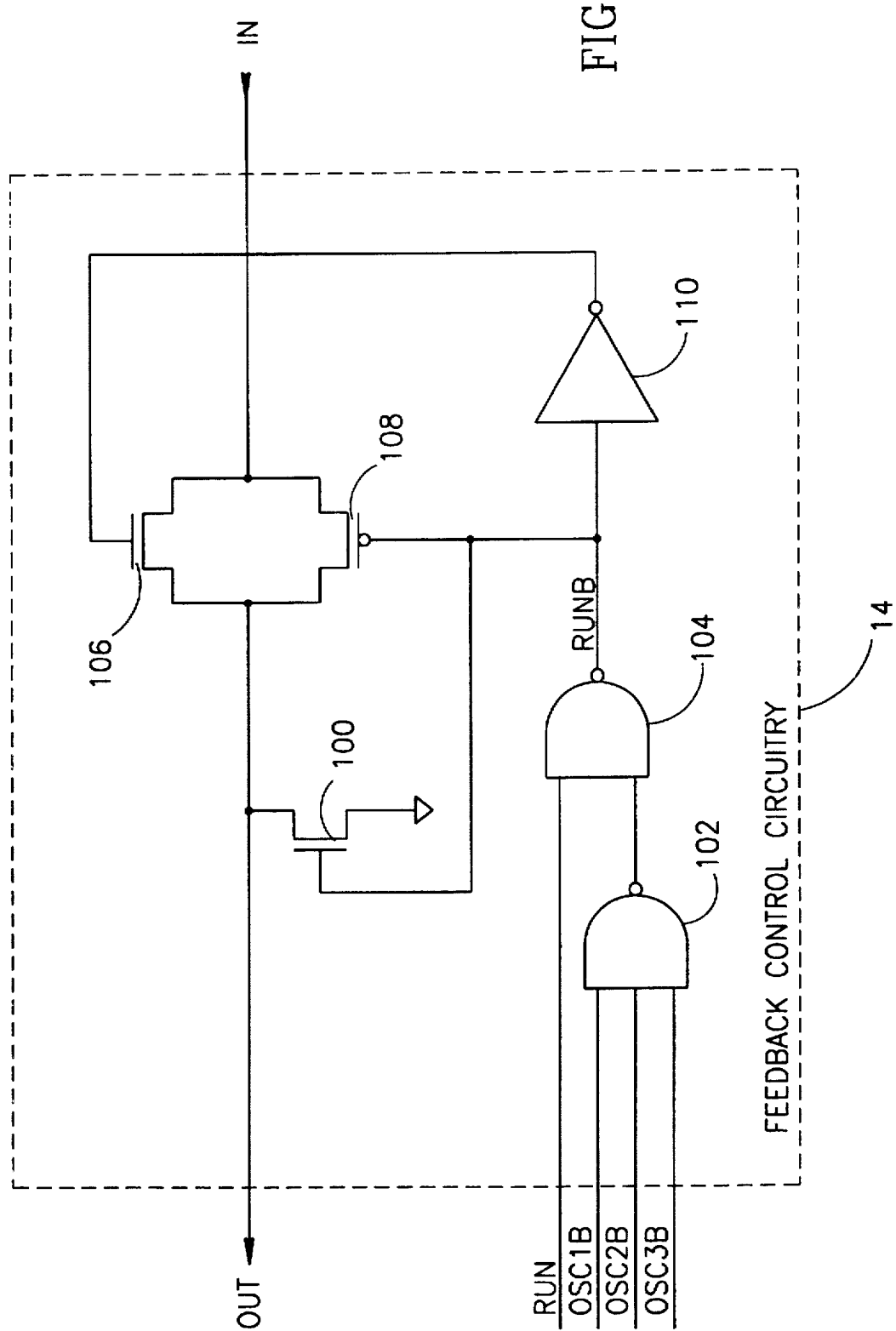
FIG. 8 is a detailed schematic diagram illustrating the feedback control circuitry portion of the ring oscillator of the present invention.

Feedback control circuitry 14 will now be described in more detail. A detailed schematic diagram illustrating the feedback control circuitry portion of ring oscillator 10 is shown in FIG. 8. Feedback control circuitry 14 comprises n-channel transistor 106, p-channel transistor 108, n-channel transistor 100 coupled to ground, NAND gates 102, 104 and inverter 110. The output signal from the last two stage inverter 22 (FIG. 4) is fed back to the source terminals of transistors 106, 108. The function of feedback control circuitry 14 is to provide on/off oscillation control of ring oscillator 10. A RUN signal provides the start and stop signal for the oscillator. When RUN is low the oscillator cannot operate, when high the oscillator is allowed to operate. The

13 signals OSC1B, OSC2B, OSC3B are generated by pull-down decoding circuitry 18, described in more detail below. For ring oscillator 10 to be on, RUN must be high and at least one of the inputs to NAND gate 102 must be low. The inputs to NAND gate 104 are thus high and RUNB is low, turning on transistor 108 and turning off transistor 100. The output of inverter 110 is high, turning on transistor 106. With transistors 106, 108 both on, the feedback signal from the last two stage inverter section 22 is passed through to the input of single stage inverter 20 (FIG. 4).

While the invention has been described with respect to a limited number of embodiments, it will be appreciated that many variations, modifications and other applications of the invention may be made.

What is claimed is:

1. A ring oscillator for generating a periodic signal having a predetermined frequency, said periodic signal stable against variations in supply voltage, temperature and process technology, said ring oscillator comprising:

N inverter stages cascaded together, each inverter stage having an input and an output, said output of the $N^{th}$ inverter stage coupled to said input of the first inverter stage, said output of said $N^{th}$ inverter stage forming an output of said ring oscillator; and each inverter stage comprising:

a p-channel transistor having a gate, source and drain, said gate coupled to said input of said inverter stage, said source coupled to a supply voltage, said drain coupled to said output of said inverter stage, said p-channel transistor turning on when the voltage on said gate of said p-channel transistor falls approximately the p-channel threshold voltage plus a delta ($V_{tp}+\Delta$) below said supply voltage;

impedance means coupled between said drain of said p-channel transistor and a ground, wherein the impedance level of said impedance means is much greater than the impedance level of said p-channel transistor when said p-channel transistor is turned on;

capacitance means coupled between said drain of said p-channel transistor and said ground;

wherein the oscillation frequency of said ring oscillator varies in accordance with a time constant τ which depends on the p-channel threshold voltage $V_{TP}$ and the parallel combination of said impedance means and said capacitance means;

an output buffer having an input and an output, said input of said output buffer coupled to said output of said $N^{th}$ inverter stage, said output of said output buffer forming a buffered output of said ring oscillator;

wherein said output buffer comprises:

a first inverter having an input, an output, a first and second terminal, said first terminal coupled to said supply voltage;

a pull-down impedance coupled between said second terminal and said ground;

a second inverter having an input, an output, a third and fourth terminal, said fourth terminal coupled to said ground, said input of said first inverter and said input of said second inverter forming said input of said output buffer;

a pull-up impedance coupled between said supply voltage and said third terminal;

a second p-channel transistor having a gate, source and drain, said gate of said second p-channel transistor coupled to said output of said first inverter, said source

14 of said second p-channel transistor coupled to said supply voltage;

a first n-channel transistor having a gate, source and drain, said gate of said first n-channel transistor coupled to said output of said second inverter, said drain of said second p-channel transistor coupled to said drain of said first n-channel transistor, said source of said first n-channel transistor coupled to said ground;

a level shifter having an input and an output, said input of said level shifter coupled to said drain of said second p-channel transistor and said drain of said first n-channel transistor;

a third inverter having an input, an output, a fifth and sixth terminal, said fifth terminal coupled to a second supply voltage, said sixth terminal coupled to said ground, said input of said third inverter coupled to said output of said level shifter, said output of said third inverter forming said output of said output buffer;

a third p-channel transistor having a gate, source and drain, said gate of said third p-channel transistor coupled to said output of said output buffer, said source of said third p-channel transistor coupled to said second supply voltage, said third p-channel transistor driving said output of said level shifter to approximately the level of said second supply voltage; and a fourth p-channel transistor having a gate, source and drain, said gate, of said fourth p-channel transistor coupled to said output of said first inverter, said source of said fourth p-channel transistor coupled to said drain of said third p-channel transistor, said drain of said fourth p-channel transistor coupled to said output of said level shifter.

2. A ring oscillator for generating a periodic signal having a predetermined frequency, said periodic signal stable against variations in supply voltage, temperature and process technology, said ring oscillator comprising:

N inverter stages cascaded together, each inverter stage having an input and an output, said output of the $N^{th}$ inverter stage coupled to said input of the first inverter stage, said output of said $N^{th}$ inverter stage forming an output of said ring oscillator; and each said inverter stage comprising:

a p-channel transistor having a gate, source and drain, said gate coupled to said input of said inverter stage, said source coupled to a supply voltage, said drain coupled to said output of said inverter stage said p-channel transistor turning on when the voltage on said gate of said p-channel transistor falls approximately the p-channel threshold voltage plus a delta ($V_{TP}+\Delta$) below said supply voltage;

impedance means coupled between said drain, of said p-channel transistor and a ground, wherein the impedance level of said impedance means is much greater than the impedance level of said p-channel transistor when said p-channel transistor is turned on, said impedance means comprising a plurality of n-channel transistors, each having a gate, source and drain, each drain coupled to the drain of said p-channel transistor, each source coupled to ground, each gate coupled to a separate gate control signal;

decoding circuitry for generating a plurality of separate gate control signals, said decoding circuitry comprising a plurality of inverters each having an input and an output, said input of each inverter coupled to an impedance control signal, said decoding circuitry also comprising a plurality of switches each having an input and an output, said input of each switch coupled to a bandgap reference voltage, said output of each switch forming one of said separate gate control signals;

capacitance means coupled between said drain of said p-chapel transistor and said ground; and wherein the oscillation frequency of said ring oscillator varies in accordance with a time constant $\tau$ which depends on the p-channel threshold voltage $V_{TP}$ and the parallel combination of said impedance means and said capacitance means.

3. The ring oscillator according to claims 1 or 2, wherein said oscillator has a period of oscillation of N times $\tau$.

4. The ring oscillator according to claims 1 or 2, wherein N is a positive odd integer large enough so that the time delay through each said inverter stage is within an order of magnitude of the time delay through said N inverter stages.

5. The ring oscillator according to claims 1 or 2, wherein said capacitance means comprises an n-well depletion n-type metal oxide semiconductor (NMOS) transistor.

6. The ring oscillator according to claim 1, wherein said impedance means comprises a plurality of n-channel transistors, each having a gate, source and drain, each drain coupled to the drain of said p-channel transistor, each source coupled to ground, each gate coupled to a separate gate control signal.

7. The ring oscillator according to claims 6 or 2, wherein each separate gate control signal comprises the presence or absence of a constant bandgap reference control voltage.

8. The ring oscillator according to claims 1 or 2, further comprising:

feedback control circuitry having an input and an output, said input of said feedback control circuitry coupled to said output of said N inverter stages, said output of said feedback control circuitry coupled to said input of said N inverter stages, said feedback control circuitry controlling the start/stop operation of said ring oscillator in accordance with a feedback control signal coupled thereto.

9. The ring oscillator according to claim 2, further comprising:

an output buffer having an input and an output, said input of said output buffer coupled to said output of said $N^{th}$ inverter stage, said output of said output buffer forming a buffered output of said ring oscillator.

10. The ring oscillator according to claim 1, wherein said first, second and third inverter comprises a p-channel transistor in series with a n-channel transistor.

11. The ring oscillator according to claim 1, wherein said level shifter comprises an n-channel transistor having a gate, said gate of said n-channel transistor coupled to said supply voltage.

12. The ring oscillator according to claim 2, wherein each switch of said plurality of switches comprises:

a p-channel transistor having a gate, source and drain, said gate of said p-channel transistor coupled to said output of one of said plurality of inverters; and a n-channel transistor having a gate, source and drain, said gate of said n-channel transistor coupled to said impedance control signal, said source of said p-channel transistor and said source of said n-channel transistor coupled to said bandgap reference voltage, said drain of said p-channel transistor and said drain of said n-channel transistor forming one of said gate control signals.

* * * * *